US011366175B2

(12) United States Patent
Peng et al.

(10) Patent No.: US 11,366,175 B2
(45) Date of Patent: Jun. 21, 2022

(54) LINEAR ASYMMETRIC METHOD FOR EXAMINING BRANCH-OUTAGE-TYPE STEADY-STATE SECURITY OF AC POWER NETWORKS

(71) Applicant: SHENZHEN UNIVERSITY, Guangdong (CN)

(72) Inventors: Jianchun Peng, Guangdong (CN); Hui Jiang, Guangdong (CN); Jian Yin, Guangdong (CN)

(73) Assignee: SHENZHEN UNIVERSITY, Guangdong (CN)

( * ) Notice: Subject to any disclaimer, the term of this patent is extended or adjusted under 35 U.S.C. 154(b) by 323 days.

(21) Appl. No.: 16/630,135

(22) PCT Filed: Jan. 28, 2019

(86) PCT No.: PCT/CN2019/073438
§ 371 (c)(1),
(2) Date: Jan. 10, 2020

(87) PCT Pub. No.: WO2020/154846
PCT Pub. Date: Aug. 6, 2020

(65) Prior Publication Data
US 2021/0223328 A1    Jul. 22, 2021

(51) Int. Cl.
*G01R 31/42* (2006.01)
*H02J 13/00* (2006.01)

(52) U.S. Cl.
CPC ........ *G01R 31/42* (2013.01); *H02J 13/00002* (2020.01); *H02J 2203/20* (2020.01)

(58) Field of Classification Search
CPC .. G01R 31/42; H02J 13/00002; H02J 2203/20
See application file for complete search history.

(56) References Cited

U.S. PATENT DOCUMENTS 6,904,372 B2    6/2005   Fulczyk et al.
9,106,152 B2    8/2015   De Brabandere et al.
(Continued)

FOREIGN PATENT DOCUMENTS

CN    102403724 A    4/2012
CN    103956733 A    7/2014
(Continued)

OTHER PUBLICATIONS

Roldan-Fernandez et al., Modelling of Transmission Systems Under Unsymmetrical Conditions and Contingency Analysis Using DIgSILENT PowerFactory, Chapter 2 of Book: PowerFactory Applications for Power System Analysis, pp. 27-59, First Online: Dec. 28, 2014 (Year: 2014).*

(Continued)

*Primary Examiner* — Toan M Le
*Assistant Examiner* — Xiuqin Sun

(57) ABSTRACT

A linear asymmetric method for examining branch-outage-type steady-state security of AC power networks is provided. Two linear expressions of bus injection active and reactive powers in terms of translation voltages and voltage angles of all buses are established. Then a linear asymmetric matrix-equation model for the steady state of the network is built considering the reference bus number. Manipulating this model produces the matrix expression of branch-not-outage-type translation voltages and voltage angles of non-reference buses and the bus impedance matrix with the reference bus discarded. The branch-outage-type translation-voltage increments and voltage-angle increments of non-reference buses are then obtained by the bus impedance matrix and the outage branch using the calculation formula of ordinary inverse of a modified matrix. The examination of the steady-state security of the network is achieved using these increments. The present application provides a fast and (Continued)

accurate method for examining branch-outage-type steady-state security of AC power networks.

6 Claims, 2 Drawing Sheets

(56) References Cited

U.S. PATENT DOCUMENTS

| | | | |
|---|---|---|---|
| 9,774,188 B2* | 9/2017 | Peng | ..................... H02J 3/0073 |
| 2003/0139887 A1 | 7/2003 | Fulczyk et al. | |
| 2013/0182477 A1 | 7/2013 | De Brabandere et al. | |
| 2016/0301209 A1 | 10/2016 | Peng et al. | |

FOREIGN PATENT DOCUMENTS

| | | | |
|---|---|---|---|
| CN | 104050604 A | 9/2014 | |
| CN | 104901309 A | 9/2015 | |
| CN | 104995810 A | 10/2015 | |
| CN | 104995811 A | 10/2015 | |
| CN | 106159947 A | 11/2016 | |
| CN | 107732904 A | 2/2018 | |
| WO | WO-2012031992 A2 | 3/2012 | |

OTHER PUBLICATIONS

Jayaweera, Steady-state security in distribution networks with large wind farms, J. Mod. Power Syst. Clean Energy (2014) 2(2): 134-142 (Year: 2014).*

International Search Report and Written Opinion of the International Search Authority issued in PCT/CN2019/073438, dated Nov. 5, 2019; ISA/CN.

* cited by examiner

LINEAR ASYMMETRIC METHOD FOR EXAMINING BRANCH-OUTAGE-TYPE STEADY-STATE SECURITY OF AC POWER NETWORKS

TECHNICAL FIELD

The present application relates to electric power engineering field, and more particularly to a linear asymmetric method for examining branch-outage-type steady-state security of alternating current (AC) power networks and a computer-readable storage medium.

BACKGROUND

The examination of branch-outage-type steady-state security of the AC power network is an important guarantee for its secure operation. Since the actual power network always consists of thousands of branches and the characteristics of the rapid response of power electronics are increasingly prominent, a new method for rapidly and accurately examining the branch-outage-type steady-state security is expected to be studied urgently.

The currently applied methods for examining the branch-outage-type steady-state security of the AC power network fall into two categories. One is implemented by establishing an approximate linear expression of branch power flow in terms of bus injection active powers of sources and loads at individual buses according to the DC power flow equations. The other is implemented by establishing a locally linear expression of branch power flow in terms of bus injection active and reactive powers of sources and loads at individual buses according to the Jacobian matrix of AC power flow equations. The former is inaccurate due to its approximate feature and the ignored impact of the bus injection reactive powers of sources and loads on the branch power flow. The latter is also inaccurate due to its local linearity. If the examination of the branch-outage-type steady-state security of the AC power network is implemented based on a complete power flow calculation, it will be impractical due to the huge amount of computational effort.

Therefore, the existing methods for examining the branch-outage-type steady-state security of the AC power network are either inaccurate or time-consuming, thus unable to meet the requirements of secure operation of modern power networks with power electronics of rapid response.

SUMMARY

An embodiment of the present application provides a linear asymmetric method for examining branch-outage-type steady-state security of AC power networks and a computer-readable storage medium, which aim to solve the problems of being inaccurate and time-consuming in the existing methods for examining the branch-outage-type steady-state security of the AC power network.

A first aspect of the embodiment of the present application provides the linear asymmetric method for examining branch-outage-type steady-state security of an AC power network, which comprises the following steps:

establishing two linear expressions of bus injection active and reactive powers of sources and loads in terms of translation voltages and voltage angles of all buses according to bus injection powers of sources and loads and branch admittances in the AC power network;

establishing a linear asymmetric matrix-equation model for the steady-state of the AC power network according to the two linear expressions of bus injection active and reactive powers of sources and loads in terms of translation voltages and voltage angles of all buses and a given reference bus serial number;

obtaining branch-not-outage-type translation voltages and voltage angles of non-reference buses and bus impedance matrix with the reference bus discarded according to the linear asymmetric matrix-equation model for the steady-state of the AC power network by using the ordinary inverse of a matrix;

obtaining branch-outage-type translation-voltage increments and voltage-angle increments of non-reference buses according to the branch-not-outage-type bus impedance matrix with the reference bus discarded and an outage branch by using the calculation formula of the ordinary inverse of a modified matrix; and examining the steady-state security of the AC power network according to the branch-not-outage-type translation voltages and voltage angles of non-reference buses and the branch-outage-type translation-voltage increments and voltage-angle increments of non-reference buses.

A second aspect of the embodiment of the present application provides a computer-readable storage medium on which a computer program is stored. The steps of the above linear asymmetric method for examining the branch-outage-type steady-state security of the AC power network are implemented when the computer program is executed by a processor.

During the implementation of the linear asymmetric method for examining the branch-outage-type steady-state security of the AC power network, the final step is examining the steady-state security of the AC power network according to the branch-not-outage-type translation voltages and voltage angles of non-reference buses and the branch-outage-type translation-voltage increments and voltage-angle increments of non-reference buses. On the one hand, since the branch-outage-induced translation-voltage increments and voltage-angle increments of non-reference buses in this method are obtained by modifying the branch-not-outage-type bus impedance matrix with the reference bus discarded, the directly finding of the solution of the ordinary inverse of a new matrix is avoided, and thus the computational effort is significantly reduced. On the other hand, since both impacts of active and reactive powers in global (not incremental) variable forms are taken into account in this method, the obtained power flow values of intact branches subject to a branch outage are accurate. Consequently, the inaccurate and time-consuming defects in the existing methods for examining the branch-outage-type steady-state security of the AC power network are solved by this method.

BRIEF DESCRIPTION OF THE DRAWINGS

In order to explain the technical solution of embodiments of the present application more clearly, the drawings used in the description of the embodiments will be briefly described hereinbelow. Obviously, the drawings in the following description are some embodiments of the present application, and for persons skilled in the art, other drawings may also be obtained on the basis of these drawings without any creative work.

DETAILED DESCRIPTION OF THE EMBODIMENTS

In the description hereinbelow, for purposes of explanation rather than limitation, specific details such as specific systematic architectures and techniques are set forth in order to provide a thorough understanding of the embodiments of the present application. However, it will be apparent to persons skilled in the art that the present application may also be implemented in absence of such specific details in other embodiments. In other instances, detailed descriptions of well-known systems, devices, circuits and methods are omitted so as not to obscure the description of the present application with unnecessary detail.

Technical solution of the present application is explained hereinbelow by particular embodiments.

Figure 1:
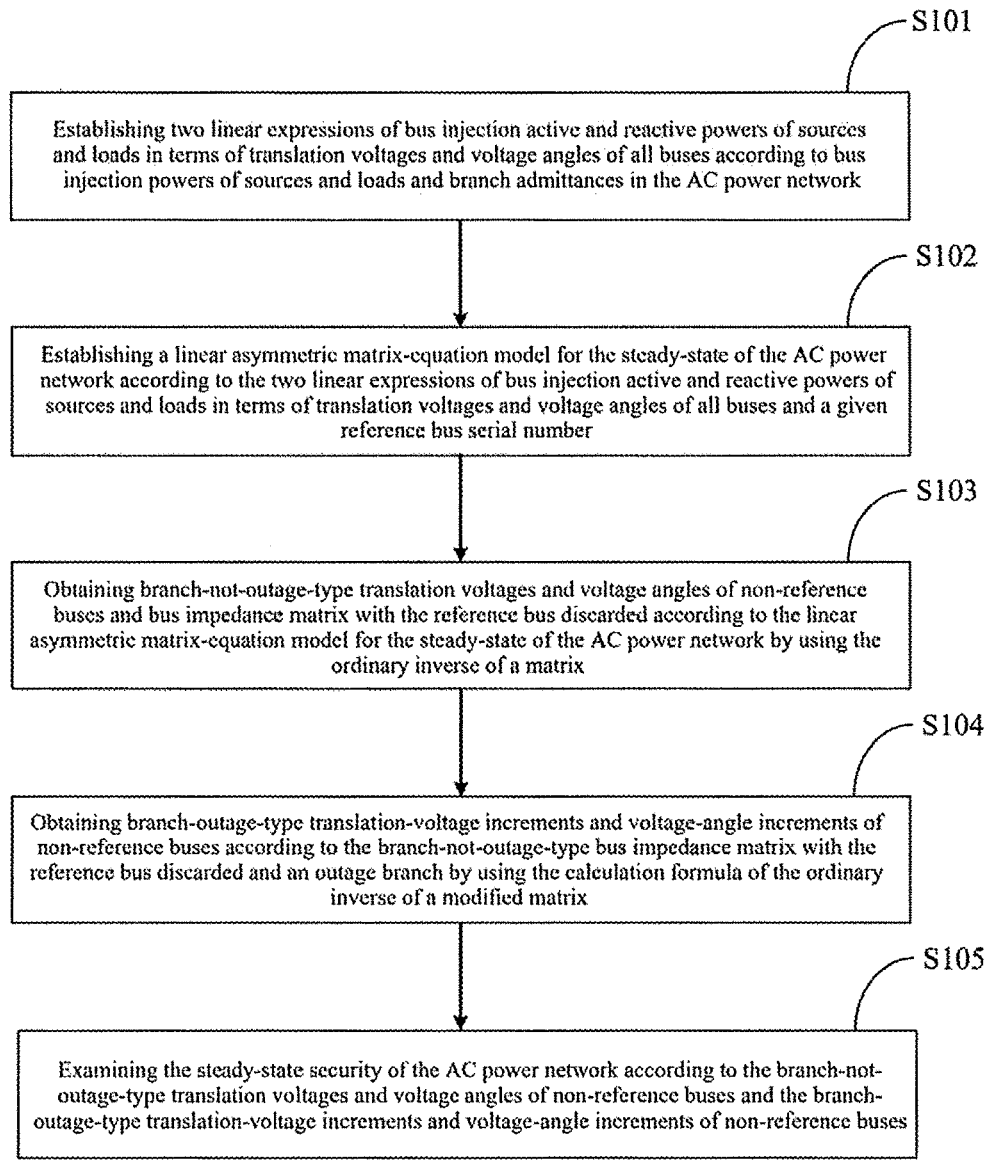
FIG. 1 is an implementation flow chart of a linear asymmetric method for examining branch-outage-type steady-state security of an AC power network in accordance with an embodiment of the present application.
Figure 2:
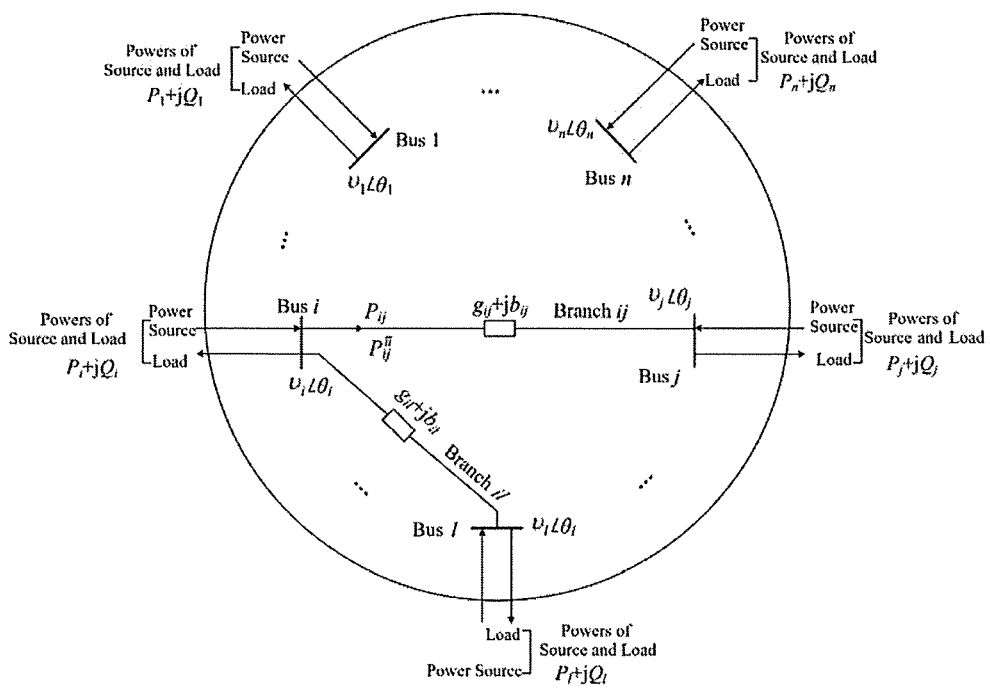
FIG. 2 is a structural schematic diagram of a universal mode of the AC power network in accordance with an embodiment of the present application.

Please refer to FIG. 1 and FIG. 2, a linear asymmetric method for examining branch-outage-type steady-state security of an AC power network may be conducted according to the following steps:

in step S101, two linear expressions of bus injection active and reactive powers of sources and loads in terms of translation voltages and voltage angles of all buses are established according to bus injection powers of sources and loads and branch admittances in the AC power network;

in step S102, a linear asymmetric matrix-equation model for the steady-state of the AC power network is established according to the two linear expressions of bus injection active and reactive powers of sources and loads in terms of translation voltages and voltage angles of all buses and a given reference bus serial number;

in step S103, branch-not-outage-type translation voltages and voltage angles of non-reference buses and bus impedance matrix with the reference bus discarded are obtained according to the linear asymmetric matrix-equation model for the steady-state of the AC power network by using the ordinary inverse of a matrix;

in step S104, branch-outage-type translation-voltage increments and voltage-angle increments of non-reference buses are obtained according to the branch-not-outage-type bus impedance matrix with the reference bus discarded and an outage branch by using the calculation formula of the ordinary inverse of a modified matrix; and in step S105, the steady-state security of the AC power network is examined according to the branch-not-outage-type translation voltages and voltage angles of non-reference buses and the branch-outage-type translation-voltage increments and voltage-angle increments of non-reference buses.

Let all branches in the AC power network be outage in turn, the examination of the steady-state security of the AC power network can be realized in a scanning way according to the above method. The power flow values, of intact branches subject to a branch outage, given by this method are obtained by modifying the branch-not-outage-type bus impedance matrix (instead of directly finding the solution of the ordinary inverse of the branch-outage-type bus impedance matrix) with the reference bus discarded. It not only significantly reduces the computational effort, but counts both impacts of active and reactive powers in global (not incremental) variable forms and leads to accurate results. Such that the problems of being inaccurate and time-consuming in the existing methods for examining the branch-outage-type steady-state security of the AC power network are solved by this method.

The step S101 of establishing the two linear expressions of bus injection active and reactive powers of sources and loads in terms of translation voltages and voltage angles of all buses according to bus injection powers of sources and loads and branch admittances in the AC power network is specifically as follows:

the two linear expressions of bus injection active and reactive powers of sources and loads in terms of translation voltages and voltage angles of all buses is established by the following equations:

$$P_i = \sum_{j=1, j\neq i}^{n} (-\theta_i b_{ij} + v_i g_{ij} + \theta_j b_{ij} - v_j g_{ij})$$

$$Q_i = \sum_{j=1, j\neq i}^{n} (-\theta_i g_{ij} - v_i b_{ij} + \theta_j g_{ij} + v_j b_{ij})$$

in which, both i and j denote serial numbers of buses in the AC power network and belong to the set of continuous natural numbers, namely belong to $\{1,2,\ldots,n\}$; n denotes the total number of buses in the AC power network; $P_i$ and $Q_i$ denote the active and reactive powers of the source and load at bus i, respectively, and referred to collectively as the powers of the source and load at bus i; the $P_i$ equals to the active power of the power source minus the active power of the load at bus i; the $Q_i$ equals to the reactive power of the power source minus the reactive power of the load at bus i; $g_{ij}$ and $b_{ij}$ denote the conductance and susceptance of branch ij connected between bus i and bus j, respectively, and referred to collectively as the admittance of branch ij; $\theta_i$ and $\theta_j$ denote the voltage angles at bus i and bus j, respectively; and $v_i$ and $v_j$ denote the translation voltages at bus i and bus j, respectively, and both the $v_i$ and $v_j$ are per-unit voltages translated by $-1.0$.

The step S102 of establishing the linear asymmetric matrix-equation model for the steady-state of the AC power network according to the two linear expressions of bus injection active and reactive powers of sources and loads in terms of translation voltages and voltage angles of all buses and a given reference bus serial number is specifically as follows:

the linear asymmetric matrix-equation model for the steady-state of the AC power network is established by the following equation:

$$[P_1\, Q_1 \ldots P_i\, Q_i \ldots P_{n-1}\, Q_{n-1}]^T = G_{\bar{0}}[\theta_1\, v_1 \ldots \theta_i\, v_i \ldots \theta_{n-1}\, v_{n-1}]^T$$

where $G_{\bar{0}}$ is set to zero at first, and then the branches are scanned and the accumulations are done as follows: $G_{\bar{0}2i-1,2i-1} = G_{\bar{0}2i-1,2i-1} - b_{ij}$, $G_{\bar{0}2i-1,2i} = G_{\bar{0}2i-1,2i} + g_{ij}$, $G_{\bar{0}2i-1,2j-1} = G_{\bar{0}2i-1,2j-1} + b_{ij}$, $G_{\bar{0}2i-1,2j} = G_{\bar{0}2i-1,2j} - g_{ij}$, $G_{\bar{0}2i,2i-1} = G_{\bar{0}2i,2i-1} - g_{ij}$, $G_{\bar{0}2i,2i} = G_{\bar{0}2i,2i} - b_{ij}$, $G_{\bar{0}2i,2j-1} = G_{\bar{0}2i,2j-1} + g_{ij}$, $G_{\bar{0}2i,2j} = G_{\bar{0}2i,2j} + b_{ij}$.

In which, both i and j denote serial numbers of buses in the AC power network and belong to the set of continuous natural numbers, namely belong to $\{1,2,\ldots,n\}$; n denotes the total number of buses in the AC power network; $P_1$ and $Q_1$ denote the active and reactive powers of the source and load at bus 1, respectively, and referred to collectively as the powers of the source and load at bus 1; the $P_1$ equals to the active power of the power source minus the active power of the load at bus 1; the $Q_1$ equals to the reactive power of the power source minus the reactive power of the load at bus 1;

$P_i$ and $Q_i$ denote the active and reactive powers of the source and load at bus i, respectively, and referred to collectively as the powers of the source and load at bus i; the $P_i$ equals to the active power of the power source minus the active power of the load at bus i; the $Q_i$ equals to the reactive power of the power source minus the reactive power of the load at bus i; $P_{n-1}$ and $Q_{n-1}$ denote the active and reactive powers of the source and load at bus n−1, respectively, and referred to collectively as the powers of the source and load at bus n−1; the $P_{n-1}$ equals to the active power of the power source minus the active power of the load at bus n−1; the $Q_{n-1}$ equals to the reactive power of the power source minus the reactive power of the load at bus n−1; $g_{ij}$ and $b_{ij}$ denote the conductance and susceptance of branch ij connected between bus i and bus j, and referred to collectively as the admittance of branch ij; $\theta_1$, $\theta_i$ and $\theta_{n-1}$ denote the voltage angles at bus 1, bus i and bus n−1, respectively; $v_1$, $v_i$ and $v_{n-1}$ denote the translation voltages at bus 1, bus i and bus n−1, respectively, and the $v_1$, $v_i$ and $v_{n-1}$ are all per-unit voltages translated by −1.0; $G_{\bar{0}}$ is the branch-not-outage-type bus admittance matrix with the reference bus discarded and a dimension of 2(n−1)×2(n−1); $G_{\bar{0}2i-1,2i-1}$, $G_{\bar{0}2i-1,2i}$, $G_{\bar{0}2i-1,2j-1}$, $G_{\bar{0}2i-1,2j}$, $G_{\bar{0}2i,2i-1}$, $G_{\bar{0}2i,2i}$, $G_{\bar{0}2i,2j-1}$ and $G_{\bar{0}2i,2j}$ are the row-2i−1 and column-2i−1, the row-2i−1 and column-2i, the row-2i−1 and column-2j−1, the row-2i−1 and column-2j, the row-2i and column-2i−1, the row-2i and column-2i, the row-2i and column-2j−1 and the row-2i and column-2j elements of the bus admittance matrix $G_{\bar{0}}$, respectively.

The above matrix-equation model for the steady-state of the AC power network is linear. The bus injection powers of the source and load as well as the translation voltage and voltage angle at the reference bus are all not introduced in this matrix-equation. So, the bus injection powers of the source and load at the reference bus are not equally treated as those at non-reference buses, namely, asymmetrically treated. This is the reason why the above model is called the linear asymmetric matrix-equation model.

The step S103 of obtaining the branch-not-outage-type translation voltages and voltage angles of non-reference buses and bus impedance matrix with the reference bus discarded according to the linear asymmetric matrix-equation model for the steady-state of the AC power network by using the ordinary inverse of a matrix is specifically as follows:

the branch-not-outage-type translation voltages and voltage angles of non-reference buses and bus impedance matrix with the reference bus discarded are obtained by the following equations:

$$[\theta_{\bar{0}1}\ v_{\bar{0}1}\ \ldots\ \theta_{\bar{0}i}\ v_{\bar{0}i}\ \ldots\ \theta_{\bar{0}n-1}\ v_{\bar{0}n-1}]^T = Z_{\bar{0}}[P_1\ Q_1\ \ldots\ P_i\ Q_i\ \ldots\ P_{n-1}\ Q_{n-1}]^T$$

$$Z_{\bar{0}} = (G_{\bar{0}})^{-1}$$

in which i denotes the serial number of a bus in the AC power network and belongs to the set of continuous natural numbers, namely belong to $\{1,2,\ldots,n\}$; n denotes the total number of buses in the AC power network; $\theta_{\bar{0}1}$, $\theta_{\bar{0}i}$ and $\theta_{\bar{0}n-1}$ denote the branch-not-outage-type voltage angles at bus 1, bus i and bus n−1, respectively; $v_{\bar{0}1}$, $v_{\bar{0}i}$ and $v_{\bar{0}n-1}$ denote the branch-not-outage-type translation voltages at bus 1, bus i and bus n−1, respectively, and the $v_{\bar{0}1}$, $v_{\bar{0}i}$ and $v_{\bar{0}n-1}$ are all per-unit voltages translated by −1.0; $P_1$ and $Q_1$ denote the active and reactive powers of the source and load at bus 1, respectively, and referred to collectively as the powers of the source and load at bus 1; the $P_1$ equals to the active power of the power source minus the active power of the load at bus 1; the $Q_1$ equals to the reactive power of the power source minus the reactive power of the load at bus 1; $P_i$ and $Q_i$ denote the active and reactive powers of the source and load at bus i, respectively, and referred to collectively as the powers of the source and load at bus i; the $P_i$ equals to the active power of the power source minus the active power of the load at bus i; the $Q_i$ equals to the reactive power of the power source minus the reactive power of the load at bus i; $P_{n-1}$ and $Q_{n-1}$ denote the active and reactive powers of the source and load at bus n−1, respectively, and referred to collectively as the powers of the source and load at bus n−1; the $P_{n-1}$ equals to the active power of the power source minus the active power of the load at bus n−1; the $Q_{n-1}$ equals to the reactive power of the power source minus the reactive power of the load at bus n−1; $G_{\bar{0}}$ is the branch-not-outage-type bus admittance matrix with the reference bus discarded and a dimension of 2(n−1)×2(n−1), and $(G_{\bar{0}})^{-1}$ denotes the ordinary inverse of the matrix $G_{\bar{0}}$; and $Z_{\bar{0}}$ is the branch-not-outage-type bus impedance matrix with the reference bus discarded.

The step S104 of obtaining the branch-outage-type translation-voltage increments and voltage-angle increments of non-reference buses according to the branch-not-outage-type bus impedance matrix with the reference bus discarded and an outage branch by using the calculation formula of the ordinary inverse of a modified matrix is specifically as follows:

assigning the branch-outage-type bus impedance matrix with the reference bus discarded a value of the branch-not-outage-type bus impedance matrix with the reference bus discarded: $Z_{\overline{ml}} = Z_{\bar{0}}$, the one-branch-outage-type bus-impedance-matrix increment and corresponding bus impedance matrix with the reference bus discarded are calculated by the following two equations produced by the calculation formula of the ordinary inverse of a modified matrix:

$$\Delta Z_{\overline{ml}} = \Delta d_{kh} Z_{\overline{ml}k}^c Z_{\overline{ml}h}^r / (1 + Z_{\overline{ml}hk} \Delta d_{kh})$$

$$Z_{\overline{ml}} = Z_{\overline{ml}} + \Delta Z_{\overline{ml}}$$

$\Delta d_{kh} \in \{$branch-$ml$-outage induced all non-zero incremental elements of the bus admittance matrix$\}$ then the branch-ml-outage-induced translation-voltage increments and voltage-angle increments of non-reference buses are calculated by the following equation:

$$[\Delta\theta_{\overline{ml}1}\ \Delta v_{\overline{ml}1}\ \ldots\ \Delta\theta_{\overline{ml}i}\ \Delta v_{\overline{ml}i}\ \ldots\ \Delta\theta_{\overline{ml}n-1}\ \Delta v_{\overline{ml}n-1}]^T = \Delta Z_{\overline{ml}}[P_1\ Q_1\ \ldots\ P_i\ Q_i\ \ldots\ P_{n-1}\ Q_{n-1}]^T$$

in which, both m and l denote serial numbers of buses in the AC power network and belong to the set of continuous natural numbers, namely belong to $\{1,2,\ldots,n\}$; n denotes the total number of buses in the AC power network; ml denotes the given outage branch which initially connected between bus i and bus j; $Z_{\bar{0}}$ denotes the branch-not-outage-type bus impedance matrix with the reference bus discarded; $Z_{\overline{ml}}$ and $\Delta Z_{\overline{ml}}$ denote branch-ml-outage-type bus impedance matrix and its increment with the reference bus discarded, respectively; k and h denote the column and row numbers of the bus impedance matrix $Z_{\overline{ml}}$, respectively; $\Delta d_{kh}$ denotes the branch-ml-outage-induced row-k and column-h non-zero incremental element of the bus admittance matrix; $Z_{\overline{ml}k}^c$, $Z_{\overline{ml}h}^r$ and $Z_{\overline{ml}hk}$ denote the k-th column vector, the h-th row vector and the row-h and column-k element of the bus impedance matrix $Z_{\overline{ml}}$, respectively; $\Delta\theta_{\overline{ml}1}$, $\Delta\theta_{\overline{ml}i}$ and $\Delta\theta_{\overline{ml}n-1}$ denote the branch-ml-outage-induced voltage-angle increments at bus 1, bus i and bus n−1, respectively; $\Delta v_{\overline{ml}1}$, $\Delta v_{\overline{ml}i}$ and $\Delta v_{\overline{ml}n-1}$ denote the branch-ml-outage-induced translation-voltage increments at bus 1, bus i and bus n−1, respectively, and the $\Delta v_{\overline{ml}1}$, $\Delta v_{\overline{ml}i}$ and $\Delta v_{\overline{ml}n-1}$ are all per-unit voltages translated by −1.0; $P_1$ and $Q_1$ denote the active and reactive powers of the source and load at bus 1, respectively, and referred to collectively as the powers of the source and load at bus 1; the $P_1$ equals to the active power of the power source minus the active power of the load at bus 1; the $Q_1$ equals to the reactive power of the power source minus the reactive power of the load at bus 1; $P_i$ and $Q_i$ denote the active and reactive powers of the source and load at bus i, respectively, and referred to collectively as the powers of the source and load at bus i; the $P_i$ equals to the active power of the power source minus the active power of the load at bus i; the $Q_i$ equals to the reactive power of the power source minus the reactive power of the load at bus i; $P_{n-1}$ and $Q_{n-1}$ denote the active and reactive powers of the source and load at bus n−1, respectively, and referred to collectively as the powers of the source and load at bus n−1; the $P_{n-1}$ equals to the active power of the power source minus the active power of the load at bus n−1; the $Q_{n-1}$ equals to the reactive power of the power source minus the reactive power of the load at bus n−1;

The step S105 of examining the steady-state security of the AC power network according to the branch-not-outage-type translation voltages and voltage angles of non-reference buses and the branch-outage-type translation-voltage increments and voltage-angle increments of non-reference buses is specifically as follows:

firstly the power flow value of an arbitrary intact branch subject to a branch outage is calculated by the following equation:

$$P_{\overline{ml}ij}=(v_{\overline{0}i}+\Delta v_{\overline{ml}i}-v_{\overline{0}j}-\Delta v_{\overline{ml}j})g_{ij}+(\theta_{\overline{0}j}+\Delta\theta_{\overline{ml}j}-\theta_{\overline{0}i}-\Delta\theta_{\overline{ml}i})b_{ij}$$

then examining whether the power flow values of all the intact branches satisfy the inequality of $-P_{ij}^{\overline{u}} \leq P_{\overline{ml}ij} \leq P_{ij}^{\overline{u}}$. When this inequality is satisfied, the steady state of the power network subject to this branch outage is secure. Otherwise, it is not secure.

In which, i, j, m and l denote serial numbers of buses in the AC power network and belong to the set of continuous natural numbers, namely belong to $\{1,2,\ldots,n\}$; n denotes the total number of buses in the AC power network; ml denotes the given outage branch which initially connected between bus i and bus j; $P_{\overline{ml}ij}$ denotes the active power flow transmitted by branch ij subject to branch ml outage; $P_{ij}^{\overline{u}}$ denotes the upper limit of the active power flow that can be transmitted by branch ij; $\theta_{\overline{0}i}$ and $\theta_{\overline{0}j}$ denote the branch-not-outage-type voltage angles at bus i and bus j, respectively; $\Delta\theta_{\overline{ml}i}$ and $\Delta\theta_{\overline{ml}j}$ denote the branch-ml-outage-induced voltage-angle increments at bus i and bus j, respectively; $v_{\overline{0}i}$ and $v_{\overline{0}j}$ denote the branch-not-outage-type translation voltages at bus i and bus j, respectively; $\Delta v_{\overline{ml}i}$ and $\Delta v_{\overline{ml}j}$ denote the branch-ml-outage-induced translation-voltage increments at bus i and bus j, respectively, and both the $\Delta v_{\overline{ml}i}$ and $\Delta v_{\overline{ml}j}$ are per-unit voltages translated by −1.0; $g_{ij}$ and $b_{ij}$ denote the conductance and susceptance of branch ij connected between bus i and bus j, and referred to collectively as the admittance of branch ij.

The above method for examining the branch-outage-type steady-state security of the AC power network is implemented according to the linear asymmetric matrix-equation model for the steady-state of the AC power network. This is the reason why the above model is called the linear asymmetric method for examining the branch-outage-type steady-state security of AC power networks. In this method, the branch-outage-induced translation-voltage increments and voltage-angle increments of non-reference buses are obtained by modifying the branch-not-outage-type bus impedance matrix with the reference bus discarded, which avoids directly finding of the solution of the ordinary inverse of a new matrix and significantly reduces the computational effort. In addition, both impacts of active and reactive powers in global (not incremental) variable forms are taken into account in this method, which allows the obtained power flow values of intact branches subject to a branch outage are accurate. Thus, the inaccurate and time-consuming defects in the existing methods for examining the branch-outage-type steady-state security of the AC power network are solved by this method.

An embodiment of the present application provides a computer-readable storage medium on which a computer program is stored. The computer program may be a source code program, an object code program, an executable file or some intermediate form. The computer program can carry out the steps of the linear asymmetric method for examining the branch-outage-type steady-state security of the AC power network as described in the above embodiments when implemented by a processor. The computer-readable storage medium may include any entity or device capable of carrying computer programs, such as a U disk, a mobile hard disk, an optical disk, a computer memory, a random-access memory and the like.

The embodiments disclosed herein are merely used to illustrate the technical solutions of the present application, but not aimed to limit the present application. Although the present application is described in detail with reference to the foregoing embodiments, it should be understood for persons skilled in the art that modifications, or equivalent replacements of some of the technical features can be implemented under the spirit of the present application, and these modifications or replacements do not deviate the essence of the corresponding technical solutions from the spirit and scope of the technical solutions of the embodiments of the present application, and should be included by the protection scope of the present application.

What is claimed is:

1. A linear asymmetric method for examining branch-outage-type steady-state security of an AC power network, comprising the following steps:

establishing two linear expressions of bus injection active and reactive powers of sources and loads in terms of translation voltages and voltage angles of all buses according to bus injection powers of sources and loads and branch admittances in the AC power network;

establishing a linear asymmetric matrix-equation model for the steady-state of the AC power network according to the two linear expressions of bus injection active and reactive powers of sources and loads in terms of translation voltages and voltage angles of all buses and a given reference bus serial number;

obtaining branch-not-outage-type translation voltages and voltage angles of non-reference buses and bus impedance matrix with the reference bus discarded according to the linear asymmetric matrix-equation model for the steady-state of the AC power network by using the ordinary inverse of a matrix;

obtaining branch-outage-type translation-voltage increments and voltage-angle increments of non-reference buses according to the branch-not-outage-type bus impedance matrix with the reference bus discarded and an outage branch by using the calculation formula of the ordinary inverse of a modified matrix; and examining the steady-state security of the AC power network according to the branch-not-outage-type translation voltages and voltage angles of non-reference buses and the branch-outage-type translation-voltage increments and voltage-angle increments of non-reference buses.

2. The linear asymmetric method according to claim 1, wherein the step of establishing the two linear expressions of bus injection active and reactive powers of sources and loads in terms of translation voltages and voltage angles of all buses according to bus injection powers of sources and loads and branch admittances in the AC power network comprises:
establishing the two linear expressions of bus injection active and reactive powers of sources and loads in terms of translation voltages and voltage angles of all buses by the following equations:

$$P_i = \sum_{j=1, j \neq i}^{n} (-\theta_i b_{ij} + v_i g_{ij} + \theta_j b_{ij} - v_j g_{ij})$$

$$Q_i = \sum_{j=1, j \neq i}^{n} (-\theta_i g_{ij} - v_i b_{ij} + \theta_j g_{ij} + v_j b_{ij})$$

wherein, both i and j denote serial numbers of buses in the AC power network and belong to the set of continuous natural numbers, namely belong to $\{1,2,\ldots,n\}$; n denotes the total number of buses in the AC power network; $P_i$ and $Q_i$ denote the active and reactive powers of the source and load at bus i, respectively, and are referred to collectively as the powers of the source and load at bus i; $g_{ij}$ and $b_{ij}$ denote the conductance and susceptance of branch ij connected between bus i and bus j, respectively, and are referred to collectively as the admittance of branch ij; $\theta_i$ and $\theta_j$ denote the voltage angles at bus i and bus j, respectively; and $v_i$ and $v_j$ denote the translation voltages at bus i and bus j, respectively, and both the $v_i$ and $v_j$ are per-unit voltages translated by $-1.0$.

3. The linear asymmetric method according to claim 1, wherein the step of establishing the linear asymmetric matrix-equation model for the steady-state of the AC power network according to the two linear expressions of bus injection active and reactive powers of sources and loads in terms of translation voltages and voltage angles of all buses and a given reference bus serial number comprises:
establishing the linear asymmetric matrix-equation model for the steady-state of the AC power network by the following equation:

$$[P_1 \, Q_1 \ldots P_i \, Q_i \ldots P_{n-1} \, Q_{n-1}]^T = G_{\bar{0}}[\theta_1 \, v_1 \ldots \theta_i \, v_i \ldots \theta_{n-1} \, v_{n-1}]^T$$

where $G_{\bar{0}}$ is set to zero at first, and then the branches are scanned and the accumulations are done as follows: $G_{\bar{0}2i-1,2i-1} = G_{\bar{0}2i-1,2i-1} - b_{ij}$, $G_{\bar{0}2i-1,2i} = G_{\bar{0}2i-1,2i} + g_{ij}$, $G_{\bar{0}2i-1,2j-1} = G_{\bar{0}2i-1,2j-1} + b_{ij}$, $G_{\bar{0}2i-1,2j} = G_{\bar{0}2i-1,2j} - g_{ij}$, $G_{\bar{0}2i,2i-1} = G_{\bar{0}2i,2i-1} - g_{ij}$, $G_{\bar{0}2i,2i} = G_{\bar{0}2i,2i} - b_{ij}$, $G_{\bar{0}2i,2j-1} = G_{\bar{0}2i,2j-1} + g_{ij}$, $G_{\bar{0}2i,2j} = G_{\bar{0}2i,2j} + b_{ij}$; and
wherein, both i and j denote serial numbers of buses in the AC power network and belong to the set of continuous natural numbers, namely belong to $\{1,2,\ldots,n\}$; n denotes the total number of buses in the AC power network; $P_1$ and $Q_1$ denote the active and reactive powers of the source and load at bus 1, respectively, and are referred to collectively as the powers of the source and load at bus 1; $P_i$ and $Q_i$ denote the active and reactive powers of the source and load at bus i, respectively, and are referred to collectively as the powers of the source and load at bus i; $P_{n-1}$ and $Q_{n-1}$ denote the active and reactive powers of the source and load at bus n−1, respectively, and are referred to collectively as the powers of the source and load at bus n−1; $g_{ij}$ and $b_{ij}$ denote the conductance and susceptance of branch ij connected between bus i and bus j, and are referred to collectively as the admittance of branch ij; $\theta_1$, $\theta_i$ and $\theta_{n-1}$ denote the voltage angles at bus 1, bus i and bus n−1, respectively; $v_1$, $v_i$ and $v_{n-1}$ denote the translation voltages at bus 1, bus i and bus n−1, respectively, and the $v_1$, $v_i$ and $v_{n-1}$ are all per-unit voltages translated by $-1.0$; $G_{\bar{0}}$ is the branch-not-outage-type bus admittance matrix with the reference bus discarded and a dimension of $2(n-1) \times 2(n-1)$; and $G_{\bar{0}2i-1,2i-1}$, $G_{\bar{0}2i-1,2i}$, $G_{\bar{0}2i-1,2j-1}$, $G_{\bar{0}2i-1,2j}$, $G_{\bar{0}2i,2i-1}$, $G_{\bar{0}2i,2i}$, $G_{\bar{0}2i,2j-1}$ and $G_{\bar{0}2i,2j}$ are elements of the bus admittance matrix $G_{\bar{0}}$.

4. The linear asymmetric method according to claim 1, wherein the step of obtaining branch-not-outage-type translation voltages and voltage angles of non-reference buses and bus impedance matrix with the reference bus discarded according to the linear asymmetric matrix-equation model for the steady-state of the AC power network by using the ordinary inverse of a matrix comprises:
obtaining branch-not-outage-type translation voltages and voltage angles of non-reference buses and bus impedance matrix with the reference bus discarded by the following equations:

$$[\theta_{\bar{0}1} \, v_{\bar{0}1} \ldots \theta_{\bar{0}i} \, v_{\bar{0}i} \ldots \theta_{\bar{0}n-1} \, v_{\bar{0}n-1}]^T = Z_{\bar{0}}[P_1 \, Q_1 \ldots P_i \, Q_i \ldots P_{n-1} \, Q_{n-1}]^T$$

$$Z_{\bar{0}} = (G_{\bar{0}})^{-1}$$

wherein, i denotes the serial number of a bus in the AC power network and belongs to the set of continuous natural numbers, namely belong to $\{1,2,\ldots,n\}$; n denotes the total number of buses in the AC power network; $\theta_{\bar{0}1}$, $\theta_{\bar{0}i}$ and $\theta_{\bar{0}n-1}$ denote the branch-not-outage-type voltage angles at bus 1, bus i and bus n−1, respectively; $v_{\bar{0}1}$, $v_{\bar{0}i}$ and $v_{\bar{0}n-1}$ denote the branch-not-outage-type translation voltages at bus 1, bus i and bus n−1, respectively, and the $v_{\bar{0}1}$, $v_{\bar{0}i}$ and $v_{\bar{0}n-1}$ are all per-unit voltages translated by $-1.0$; $P_1$ and $Q_1$ denote the active and reactive powers of the source and load at bus 1, respectively, and are referred to collectively as the powers of the source and load at bus 1; $P_i$ and $Q_i$ denote the active and reactive powers of the source and load at bus i, respectively, and are referred to collectively as the powers of the source and load at bus i; $P_{n-1}$ and $Q_{n-1}$ denote the active and reactive powers of the source and load at bus n−1, respectively, and are referred to collectively as the powers of the source and load at bus n−1; $G_{\bar{0}}$ is the branch-not-outage-type bus admittance matrix with the reference bus discarded and a dimension of $2(n-1) \times 2(n-1)$, and $(G_{\bar{0}})^{-1}$ denotes the ordinary inverse of the matrix $G_{\bar{0}}$; and $Z_{\bar{0}}$ is the branch-not-outage-type bus impedance matrix with the reference bus discarded.

5. The linear asymmetric method according to claim 1, wherein the step of obtaining the branch-outage-type translation-voltage increments and voltage-angle increments of non-reference buses according to the branch-not-outage-type bus impedance matrix with the reference bus discarded and an outage branch by using the calculation formula of the ordinary inverse of a modified matrix comprises:
assigning the branch-outage-type bus impedance matrix with the reference bus discarded a value of the branch-not-outage-type bus impedance matrix with the reference bus discarded: $Z_{\overline{ml}} = Z_{\bar{0}}$, the one-branch-outagetype bus-impedance-matrix increment and corresponding bus impedance matrix with the reference bus discarded are calculated by the following two equations produced by the calculation formula of the ordinary inverse of a modified matrix:

$$\Delta Z_{\overline{ml}} = -\Delta d_{kh} Z_{\overline{ml}k}^{c} Z_{\overline{ml}h}^{r}/(1+Z_{\overline{ml}hk}\Delta d_{kh})$$

$$Z_{\overline{ml}} = Z_{\overline{ml}} + \Delta Z_{\overline{ml}}$$

$\Delta d_{kh} \in \{\text{branch-}ml\text{-outage-induced all non-zero incremental elements of the bus admittance matrix}\}$ then the branch-ml-outage-induced translation-voltage increments and voltage-angle increments of non-reference buses are calculated by the following equation:

$$[\Delta\theta_{\overline{ml}1}\,\Delta v_{\overline{ml}1}\ldots\Delta\theta_{\overline{ml}i}\,\Delta v_{\overline{ml}i}\ldots\Delta\theta_{\overline{ml}n-1}\,\Delta v_{\overline{ml}n-1}]^T = \Delta Z_{\overline{ml}}[P_1\,Q_1\ldots P_i\,Q_i\ldots P_{n-1}\,Q_{n-1}]^T$$

wherein both m and l denote serial numbers of buses in the AC power network and belong to the set of continuous natural numbers, namely belong to $\{1,2,\ldots,n\}$; n denotes the total number of buses in the AC power network; ml denotes the given outage branch which initially connected between bus i and bus j; $Z_{\overline{0}}$ denotes the branch-not-outage-type bus impedance matrix with the reference bus discarded; $Z_{\overline{ml}}$ and $\Delta Z_{\overline{ml}}$ denote branch-ml-outage-type bus impedance matrix and its increment with the reference bus discarded, respectively; k and h denote the column and row numbers of the bus impedance matrix $Z_{\overline{ml}}$, respectively; $\Delta d_{kh}$ denotes the branch-ml-outage-induced row-k and column-h non-zero incremental element of the bus admittance matrix; $Z_{\overline{ml}k}^{c}$, $Z_{\overline{ml}h}^{r}$ and $Z_{\overline{ml}hk}$ denote the k-th column vector, the h-th row vector and the row-h and column-k element of the bus impedance matrix $Z_{\overline{ml}}$, respectively; $\Delta\theta_{\overline{ml}1}$, $\Delta\theta_{\overline{ml}i}$ and $\Delta\theta_{\overline{ml}n-1}$ denote the branch-ml-outage-induced voltage-angle increments at bus 1, bus i and bus n−1, respectively; $\Delta v_{\overline{ml}1}$, $\Delta v_{\overline{ml}i}$ and $\Delta v_{\overline{ml}n-1}$ denote the branch-ml-outage-induced translation-voltage increments at bus 1, bus i and bus n−1, respectively, and the $\Delta v_{\overline{ml}1}$, $\Delta v_{\overline{ml}i}$ and $\Delta v_{\overline{ml}n-1}$ are all per-unit voltages translated by −1.0; $P_1$ and $Q_1$ denote the active and reactive powers of the source and load at bus 1, respectively, and are referred to collectively as the powers of the source and load at bus 1; $P_i$ and $Q_i$ denote the active and reactive powers of the source and load at bus i, respectively, and are referred to collectively as the powers of the source and load at bus i; $P_{n-1}$ and $Q_{n-1}$ denote the active and reactive powers of the source and load at bus n−1, respectively, and are referred to collectively as the powers of the source and load at bus n−1.

6. The linear asymmetric method according to claim 1, wherein the step of examining the steady-state security of the AC power network according to the branch-not-outage-type translation voltages and voltage angles of non-reference buses and the branch-outage-type translation-voltage increments and voltage-angle increments of non-reference buses comprises:

calculating the power flow value of an arbitrary intact branch subject to a branch outage by the following equation:

$$P_{\overline{ml}ij} = (v_{\overline{0}i} + \Delta v_{\overline{ml}i} - v_{\overline{0}j} - \Delta v_{\overline{ml}j})g_{ij} + (\theta_{\overline{0}j} + \Delta\theta_{\overline{ml}j} - \theta_{\overline{0}i} - \Delta\theta_{\overline{ml}i})b_{ij}$$

examining whether the power flow values of all the intact branches satisfy the inequality of $-P_{ij}^{u} \le P_{\overline{ml}ij} \le P_{ij}^{u}$; when this inequality is satisfied, the steady state of the power network subject to this branch outage is secure, otherwise it is not secure; and wherein i, j, m and l denote serial numbers of buses in the AC power network and belong to the set of continuous natural numbers, namely belong to $\{1,2,\ldots,n\}$; n denotes the total number of buses in the AC power network; ml denotes the given outage branch which initially connected between bus i and bus j; $P_{\overline{ml}ij}$ denotes the active power flow transmitted by branch ij subject to branch ml outage; $P_{ij}^{u}$ denotes the upper limit of the active power flow that can be transmitted by branch ij; $\theta_{\overline{0}i}$ and $\theta_{\overline{0}j}$ denote the branch-not-outage-type voltage angles at bus i and bus j, respectively; $\Delta\theta_{\overline{ml}i}$ and $\Delta\theta_{\overline{ml}j}$ denote the branch-ml-outage-induced voltage-angle increments at bus i and bus j, respectively; $v_{\overline{0}i}$ and $v_{\overline{0}j}$ denote the branch-not-outage-type translation voltages at bus i and bus j, respectively; $\Delta v_{\overline{ml}i}$ and $\Delta v_{\overline{ml}j}$ denote the branch-ml-outage-induced translation-voltage increments at bus i and bus j, respectively, and both the $\Delta v_{\overline{ml}i}$ and $\Delta v_{\overline{ml}j}$ are per-unit voltages translated by −1.0; $g_{ij}$ and $b_{ij}$ denote the conductance and susceptance of branch ij connected between bus i and bus j, and are referred to collectively as the admittance of branch ij.

* * * * *